United States Patent [19]

Williams

[11] 3,778,727

[45] Dec. 11, 1973

[54] CRYSTAL CONTROLLED FREQUENCY DISCRIMINATOR

[75] Inventor: Arthur B. Williams, Smithtown, N.Y.

[73] Assignee: The Singer Company, Little Falls, N.J.

[22] Filed: May 11, 1972

[21] Appl. No.: 252,369

[52] U.S. Cl. .................. 329/104, 307/234, 325/320, 328/112, 329/112, 329/145

[51] Int. Cl. .................. H04l 27/14

[58] Field of Search .................. 329/145, 146, 104, 329/106, 107, 110, 112, 122; 307/234; 328/58, 61, 112; 325/320; 331/158

[56] References Cited

UNITED STATES PATENTS

| | | | |
|---|---|---|---|
| 3,656,064 | 4/1972 | Giles et al. | 329/145 |
| 3,571,712 | 3/1971 | Hellwarth | 329/104 X |
| 3,325,750 | 6/1967 | O'Hern et al. | 331/158 X |
| 3,122,707 | 2/1964 | Godbey | 331/158 X |
| 3,392,337 | 7/1968 | Newburger | 329/145 |

OTHER PUBLICATIONS

Jones–"Digital Frequency Discriminator" I.B.M. Technical Disclosure Bulletin, Vol. 13, No. 11, April, 1971, p 3421–3422.

*Primary Examiner*—Alfred L. Brody
*Attorney*—S. A. Giarratana et al.

[57] ABSTRACT

A frequency discriminator has an accurately controlled delay time for delaying a frequency modulated signal for a fixed time interval such that the frequency deviation of the input signal is converted into a related phase deviation. An EXCLUSIVE OR circuit compares the input signal with the delayed input signal to produce an output signal of constant amplitude and duration pulses having a pulse repetition rate double that of the carrier frequency of the input signal. The fixed delay is provided by a multistage shift register that is clocked by a crystal controlled oscillator.

6 Claims, 2 Drawing Figures

CRYSTAL CONTROLLED FREQUENCY DISCRIMINATOR

BACKGROUND OF THE INVENTION

1. Field of Art

This invention relates to a frequency discriminator having a substantially linear voltage versus frequency characteristic and more particular to a linear frequency discriminator having an output voltage versus frequency characteristic that is controlled by a crystal controlled oscillator.

2. Prior Art

Many frequency discriminators are of the single or double tuned variety. The linearity of such frequency discriminators depends upon the linearity of the phase-shift or amplitude versus frequency characteristics of the tuned circuit(s). Generally, tuned circuit frequency discriminators have only a small linear frequency deviation range. Additionally, the tuned circuits(s) must be precisely adjusted to minimize distortion over the narrow operating range. Further, inductor/capacitor type tuned circuits are not especially stable with time and temperature. Drift can cause excessive offset errors, especially in narrow-band frequency discriminators.

U.S. Pat. No. 3,392,337 teaches improving the linearity of frequency discriminators by using a delay line to retard the frequency modulated input signal. A phase detector compares the delayed input signal with the undelayed input signal to produce an output having a frequency equal to the carrier frequency of the input signal but having an amplitude related to the phase difference between the delayed and undelayed input signal. This output signal is averaged by a low pass filter to produce a signal having an amplitude related to the frequency modulation of the input signal. Although this arrangement provides improved linearity over greater operating frequency ranges, the linearity is dependent upon the stability of the delay provided by the delay line. Generally, conventional delay lines have to be carefully adjusted and trimmed. More important, the delay provided by delay lines varies with time, temperature and frequency of input signal thereby limiting the degree of linearity obtainable with such a frequency discriminator. Additionally, delay lines are large and bulky thereby not lending themselves to miniaturization techniques. Further, it is often necessary that the rate of frequency deviation or change be high compared to the carrier frequency. In such instances the low pass filter disclosed in U.S. Pat. No. 3,392,337 cannot distinguish between the carrier signal and the frequency modulation thereby providing an excessively distorted output signal. A principal object of this invention is to overcome these and other disadvantages of the prior art.

BRIEF DESCRIPTION OF THE DRAWINGS

Various objects, advantages, and aspects of the nature of this invention will be clearly apparent from the following detailed description taken in conjunction with the following drawings in which.

DETAILED DESCRIPTION

Figure 1:
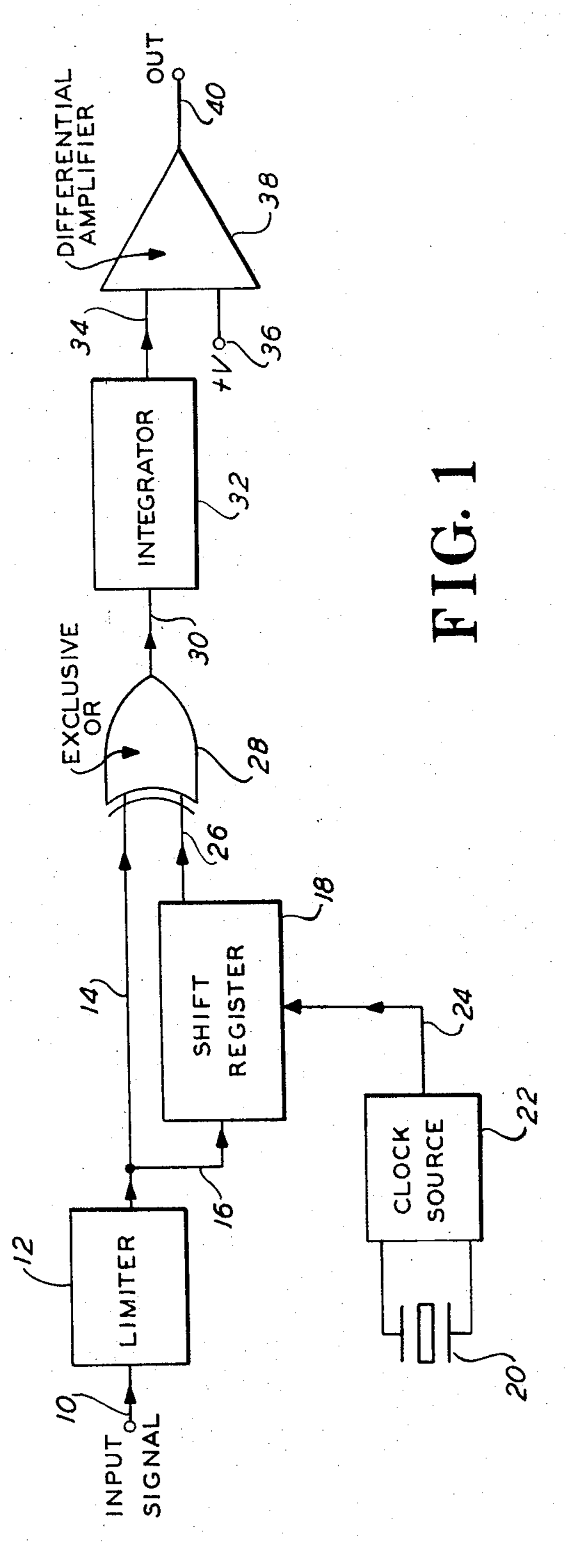
FIG. 1 is a logic diagram of a preferred embodiment of the present invention.

Referring now to FIG. 1, a frequency modulated sine wave input signal on lead 10 is converted into a frequency modulated square wave signal appearing on leads 14 and 16 by a limiter 12. Since the modulated input signal may vary in amplitude when the apparatus of this invention is used in a remotely located receiver, in a preferred embodiment of this invention limiter 12 comprised a very high gain Operational Amplifier (not shown), such that very small amplitude input signals caused saturation resulting in square wave output signals. The square wave output may be level shifted, or clipped, to the desired voltage levels by means of one or more biased diodes (not shown) in a well known manner.

The frequency modulated square wave appearing on lead 16 is applied as an input signal to a multistage shift register 18. A crystal 20 controlled oscillator 22 provides a clock signal on lead 24 to the shift register 18 to clock the frequency modulated square wave signal through the shift register. The frequency modulated square wave thus appears as an output from the shift register on lead 26 delayed in time by an interval determined by the number of stages in the shift register 18 and the frequency of the oscillator 22. In accordance with a preferred embodiment of this invention, the shift register 18 comprised a monolithlic MOS integrated circuit and the oscillator 22 comprised a closed loop including two series connected, integrated TTL digital inverters having positive feedback at the series resonant frequency of crystal 20. If desired, the oscillator sine wave output can be converted into a square wave prior to being applied to the shift register 18 by overdriving an amplifier (not shown), or by any other well known technique. As the carrier frequency of the input signal increases or decreases, the fixed delay provided by the shift register causes a corresponding increased or decreased phase shift, respectively, between the delayed input signal on lead 26 and the input signal on lead 14.

The input signal appearing on lead 14 constitutes one input to an EXCLUSIVE OR gate 28 the other input of which is the delayed input signal on lead 26. EXCLUSIVE OR gate 28 compares the phase of the two input signals by performing an EXCLUSIVE OR function resulting in an output signal on lead 30 that is "high" when both inputs are different and is "low" when both inputs are the same. As described below in detail, this results in an output signal of constant amplitude and duration pulses having a pulse repetition rate twice that of the carrier frequency of the input signal, with the spacing between the pulses being determined by the phase difference between the signals applied to the EXCLUSIVE OR gate 28 which in turn is determined by the carrier frequency of the frequency modulated input signal. In accordance with a preferred embodiment of this invention, the EXCLUSIVE OR gate 28 was realized as a TTL integrated circuit.

The output on lead 30 is applied to an integrator, or low pass filter 32, which averages the signal on lead 30. Since the pulse repetition rate of the constant amplitude and duration pulses appearing on lead 30 is directly proportional to frequency, the average of these pulses, appearing on lead 34, is a DC signal the amplitude of which deviates in direction relation to the frequency deviation of the frequency modulated carrier signal input. In accordance with a preferred embodiment of this invention, the integrator 32 comprised an inductorless, integrated circuit that included an Operational Amplifier of unity gain coupled to a resistor-capacitor network as disclosed in the August 18, 1969 issue of "Electronics," a McGraw-Hill Publication.

The signal on lead 34 constitutes the demodulated signal and may comprise an audio signal, or the like. In accordance with one embodiment of the present invention the input signal comprised a bifrequency modulated, or FSK (frequency-shift-keyed) signal, having a first modulating frequency (lower than the center frequency of the carrier) denoting a space, or a logic ZERO, and a second frequency (higher than the center frequency of the carrier signal) denoting a mark, or a logic ONE. When such an input signal is received, the output from the integrator 32 is bi-level, consisting of a first amplitude steady DC level representative of a ZERO and a second higher amplitude steady DC level representative of a ONE. In order to convert these level changes into a signal train having steep trailing and leading edges and sharp corners, the signals on lead 34 are applied to a differential amplifier 38 the other input of which on lead 36 comprises a positive reference potential of a magnitude intermediate the two levels appearing on lead 34. Accordingly, the operation of the differential amplifier 38 is such that the presence of a ZERO level on lead 34 is less positive than the positive potential on lead 36 thereby causing the potential on output lead 40 to be low. Likewise, the presence of a ONE level on lead 34 is more positive than the positive potential on lead 36 thereby causing the potential on output lead 40 to be high. The demodulated data on output lead 40 is then in suitable form for application to a computer or a teletype.

Figure 2:
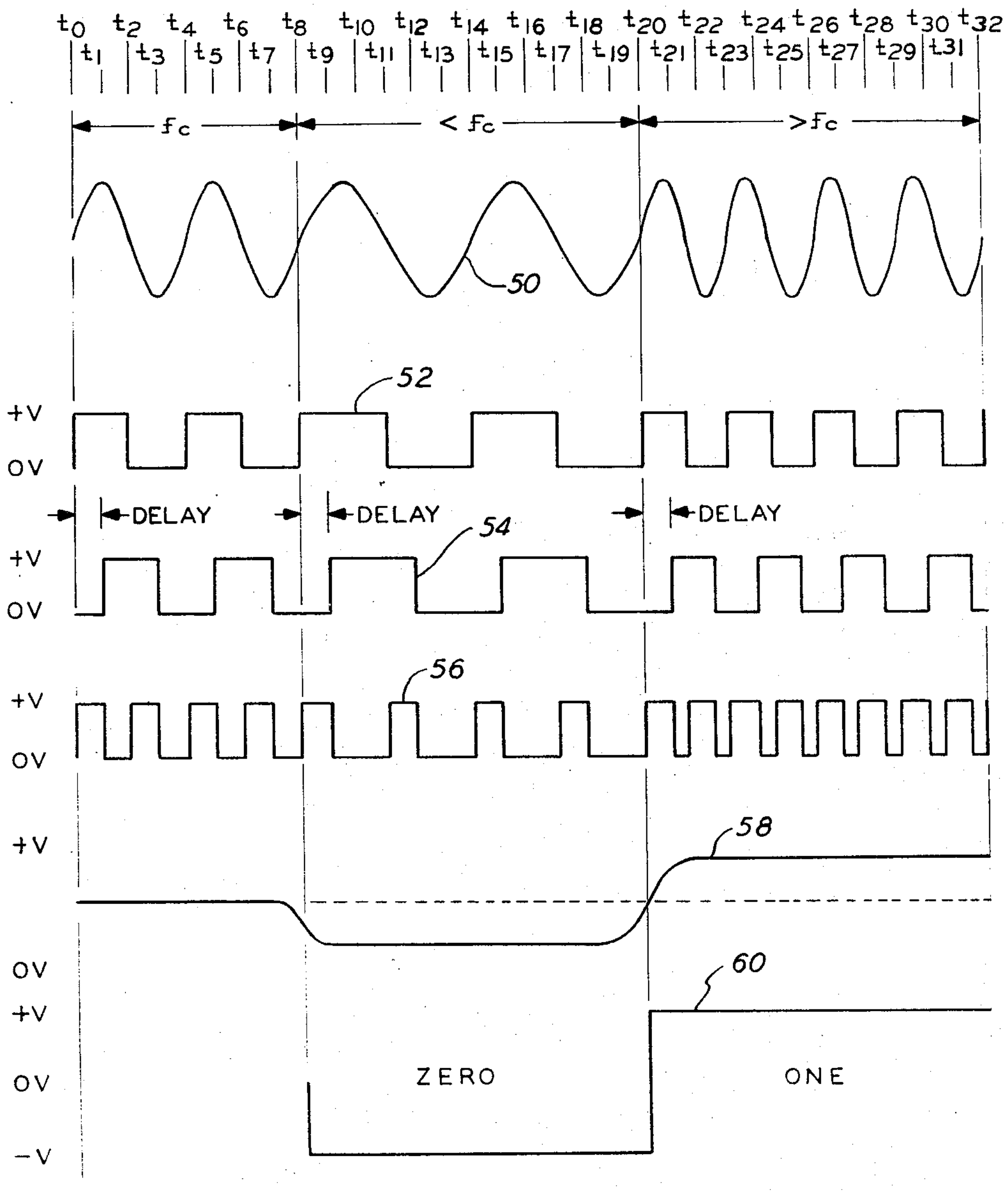
FIG. 2 illustrates various idealized waveforms in the apparatus of FIG. 1.

The operation of the present invention will be even more apparent from consideration of FIG. 1 and the time interval $t_0$ to $t_8$ of FIG. 2. Waveform 50 illustrates a constant frequency which may be considered as the center frequency fc of a frequency modulated signal appearing on lead 10. Waveform 52 illustrates the input signal appearing on leads 14 and 16 after being squared by the limiter 12 and waveform 54 illustrates the input signal appearing on lead 26 after being delayed by passing through the shift register 18. As shown, the delay through the shift register is such that waveform 54 lags waveform 52 by one quarter of a cycle or −90°. Waveforms 52 and 54 constitute the inputs to EXCLUSIVE OR gate 28 and are of unlike magnitude during times $t_0$–$t_1$, $t_2$–$t_3$, $t_4$–$t_5$ and $t_6$–$t_7$ causing the output from the EXCLUSIVE OR gate, as illustrated by waveform 56, to be high during these time intervals. Likewise, waveforms 52 and 54 are of like polarity during times $t_1$–$t_2$, $t_3$–$t_4$, $t_5$–$t_6$ and $t_7$–$t_8$, causing the output 56 of the EXCLUSIVE OR gate 28 to be low for these time intervals. Reference to waveform 56 shows that each output pulse has the same amplitude and the same duration which is equal in time to the delay produced by the shift register 18. Additionally, two pulses occur for each cycle ($t_0$–$t_4$) of input thereby causing the output 56 to have a pulse repetition rate that is double the frequency of the input signal fc. As clearly shown in FIG. 2, the output 56 during the time interval $t_0$–$t_8$ has a duty cycle of 50 percent. Accordingly, averaging of the waveform 56 by the integrator 32 causes a DC voltage level on the lead 34 equal to one half of the amplitude V of the output 56 pulses as shown by waveform 58.

Assume now that the carrier frequency 50 is decreased to a lower frequency having a period half again as long as the center frequency fc. As shown by the time interval $t_8$–$t_{20}$ of FIG. 2, this causes the delayed input signal 54 to lag the input signal 52 by the same amount. However, since the frequency period is now longer ($t_8$–$t_{14}$), the same amount of delay is a smaller portion (one sixth) of an input cycle thereby causing the delayed input signal 54 to lag the input signal 52 by only −60. As shown, this causes the input to the EXCLUSIVE OR gate to be unlike during the time intervals $t_8$–$t_9$, $t_{11}$–$t_{12}$, $t_{14}$–$t_{15}$ and $t_{17}$–$t_{18}$, and to have the same polarity at the other time intervals. As shown by waveform 56, this results in output pulses having a duration and amplitude equal to those pulses produced by the center frequency fc during the time interval $t_0$–$t_8$. Also, the pulse repetition rate is double the input frequency. However, the spacing between the pulses is greater due to the smaller phase shift between signals 52 and 54 due to the lower frequency but constant delay time. This results in a 33⅓ percent duty cycle that, when averaged by the integrator 32, produced a DC level that is 33⅓ percent of the amplitude V of the pulse output 56. As shown by waveform 58, this level is less positive than the DC level produced by the center frequency during time interval $t_0$–$t_8$.

Assume now that the carrier frequency 50 is increased to a higher frequency having a period three fourths as long as the center frequency fc. As shown by the time interval $t_{20}$–$t_{32}$ of FIG. 2, this causes the delayed input 54 to lag the input signal 52 by the same amount. However, since the frequency period is now shorter ($t_{20}$–$t_{23}$), the same amount of delay is a larger portion (one third) of an input cycle, thereby causing the delayed input signal 54 to lag the input signal 52 by −120°. As shown, this causes the input to the EXCLUSIVE OR gate 28 to be unlike more than it is the same. As shown by waveform 56, this results in output pulses having a duration and amplitude equal to those produced by the center frequency ($t_0$–$t_8$). Also, the pulse repetition rate is double the input frequency. However, the spacing between the pulses is less due to the larger phase shift between signals 52 and 54 due to the higher frequency but constant delay time. This results in a 66⅔ percent duty cycle that, when averaged by the integrator 32, produces a DC level that is 66⅔ percent of the amplitude V of the pulse output 56. As shown by waveform 58, this level is more positive than the DC level produced by the center frequency fc.

As is now apparent, the apparatus of FIG. 1 functions to produce a DC output on lead 34 from the integrator 32 the amplitude deviations of which are directly related to the frequency deviations of the frequency modulated input signal 50. If the input signal is an FSK signal, the center frequency is not present, only a first frequency indicative of a logic ZERO (time $t_8$–$t_{20}$) and a second higher frequency (time $t_{20}$–$t_{32}$) indicative of a logic ONE. By applying a biasing potential to lead 36 of the differential amplifier 38 having a magnitude intermediate the voltage levels 58 produced by demodulating a logic ZERO and a logic ONE, the output of the differential amplifier 38 on lead 40 is sharply defined as shown by waveform 60 and is a replica of the data information contained in the FSK signal.

A perusal of FIG. 2 shows that, with a center frequency fc delay equivalent to a quarter of a cycle, the maximum high frequency deviation is defined by the frequency which causes the signals 52 and 54 to be 180° out of phase. This will occur whenever the period of the frequency is twice the delay time provided by the shifting register 18, or a frequency that is twice the center frequency. As will now be apparent, the maximum high frequency deviation can be greater than twice the center frequency if the delay at the center frequency causes a phase shift of less than −90°. This reduced delay time, for the same center frequency, can be obtained by increasing the frequency of the oscillator 22 or by decreasing the number of stages in the shift register 18.

Also, a perusual of FIG. 2 shows that as the frequency decreases, the spacing between the output pulses 56 increases. Accordingly, the maximum low frequency deviation is determined by the smallest averaged voltage level form the integrator 32 that can be recognized. As is well known to those skilled in the art, however, the desired frequency deviation is the same above and below the center frequency in frequency modulation systems. Accordingly, a delay of a quarter of a cycle at the center frequency produces a practical bandwidth of ± 100 percent fc.

By increasing the delay above a quarter of a cycle at the center frequency, the bandwidth is reduced. However, a given frequency deviation will produce a greater amplitude variation at the output of the integrator 32. Correspondingly, decreasing the delay below a quarter of cycle at the center frequency increases the bandwidth but a given frequency deviation will produce a smaller amplitude variation at the output of the integrator 32. Assuming a delay of a quarter of a cycle at the center frequency and a shift register 18 having 64 stages, the delay of the shift register 18 is equal to 64 clock periods. If the clock is 256 times the center frequency fc, the clock period is 1/256fc and the delay time is; 64/256fc or 1/4fc; corresponding to a phase shift of −90° at the center frequency. If the incoming frequency were to increase or decrease, the fixed delay would correspond, respectively, to an increasing or decreasing phase shift as described, with the phase shift $\phi$ being defined by:

$\phi = 90fx/fc$ where fx is the input frequency.

Since the duty cycle is 50 percent at the center frequency, the duty cycle can be defined by:

% Duty Cycle = $50fx/fc$.

Assuming that the integrator 32 output varies between 0 and + V volts, then integration of the duty cycle equation defines the output voltage Vo appearing on lead 34 as:

Vo = $Vfx/2fc$ which shows that discriminator action has been achieved and that the output voltage vo versus input frequency characteristic is perfectly linear and dependent only upon the stability of the delay time. Since the delay time is dependent upon the frequency of the clock signal which is precisely controlled by a crystal 20 which is independent of time and temperature, the delay time is readily and precisely controlled to provide more linear discriminator characteristics than heretofore obtainable by the prior art. Additionally, by merely changing the crystal 20 which can be readily accomplished manually or automatically, the center frequency fc of the operating bandwidth of the apparatus of FIG. 1 can easily be changed. Further, the crystal 20 is not large or bulky and thus lends itself to use with miniaturized circuitry. In this regard it is noted that the remaining components of the apparatus of FIG. 1 can readily be achieved by the use of integrated and/or hybrid circuits.

As discussed above the output from the EXCLUSIVE OR gate 28 has a pulse repetition rate that is twice the frequency of the input signal even though the information rate contained therein remains the same. This enables the frequency deviation of the input signal to be at a rate nearly equal to the carrier frequency of the input signal since the integrator 32 can readily be designed as a low pass filter to reject frequencies twice as great, or more, than the input frequency and yet precisely average frequencies equal to the input frequency, and lower, to produce a replica of the information contained in the frequency modulated input signal.

For a narrower bandwidth, assume a delay time equal to three quarters of the center frequency. The phase shift at the center frequency fc is −270° since the delay time is ¾ fc. The phase shift $\phi$ in degrees is defined by:

$\phi = -270fx/fc$ and the duty cycle of the EXCLUSIVE OR output 56 is 100 percent at fx = ⅔ fc, since the phase shift $\phi$ approaches 180° at this frequency, 50% at fx =⅔ fc since the phase shift $\phi$ approaches 180° at this frequency, and 0° at fx =4/3 fc, since the phase shift $\phi$ is 360° at this frequency. The bandwidth is thus restricted to ⅔ to 4/3 fc, or 66 ⅔%. The corresponding duty cycle equation can be derived by determining the slope and Y axis intercept of the duty cycle versus frequency fx straight line intersecting 0% duty cycle, 50% duty cycle and 100% duty cycle at frequencies fx of 4/3 fc, fc and ⅔ fc respectively. The result is:

% Duty Cycle = 200 − 150 fx/fc.

The output voltage Vo for a supply voltage of V is then given by:

Vo = V (2−1.5 fx/fc).

Differentiating the two above described Vo equations with respect to fx results in the derivatives of 1.2 and − 1 ½, respectively, deviation is three times as large as when the delay is a quarter of a cycle.

The present invention has been described with reference to a preferred embodiment. It is to be understood that other arrangements and modifications may be devised by those skilled in the art without departing from the spirit and scope of this invention as defined by the appended claims.

What is claimed is:

1. Demodulating apparatus comprising:

a register having a plurality of stages and responsive to a bi-frequency modulated input signal for delaying its output signal for a fixed time interval, clock signal generating means coupled to said register for providing a signal that clocks said frequency modulated input signal through said register, said fixed time interval being determined by the number of stages of said register and the frequency of said clock signal, and gating means coupled to receive said modulated input signal and said delayed register output signal for producing an output signal having pulses of constant amplitude and duration with the duty cycle of said pulses being determined by the phase difference between said modulated input signal and said delayed register output signal, and circuit means coupled to said gating means for averaging out the output signal of said gating means and producing a bi-level signal which represents the bi-level modulation of said modulated input signal said circuit means further including means for squaring the bi-level signal to produce a second bi-level signal more suitable for application to a computer.

2. The apparatus according to claim 1 wherein;

said gating means includes an EXCLUSIVE OR circuit, and said output signal of said gating means has a pulse repetition rate that is twice the carrier frequency of said modulated input signal.

3. The apparatus according to claim 1 wherein;

said clock generating means includes a crystal controlled oscillator to produce a fixed frequency clock signal.

4. The apparatus according to claim 1 further including;

a limiter interposed between said frequency modulated input signal and said gating means and said register for squaring said modulated input signal.

5. The apparatus according to claim 1, in which said averaging circuitry comprises means for integrating the output signal of said gating means.

6. The apparatus according to claim 1 wherein said squaring means includes;

a differential amplifier.

* * * * *